(12) United States Patent
Cheng et al.

(10) Patent No.: US 9,007,107 B2
(45) Date of Patent: Apr. 14, 2015

(54) SIGNAL GENERATING CIRCUIT AND METHOD THEREOF

(71) Applicant: Realtek Semiconductor Corp., HsinChu (TW)

(72) Inventors: Ching-Sheng Cheng, Nantou County (TW); Chao-Yang Tsai, New Taipei (TW)

(73) Assignee: Realtek Semiconductor Corp., Science Park, Hsinchu (TW)

( * ) Notice: Subject to any disclaimer, the term of this patent is extended or adjusted under 35 U.S.C. 154(b) by 0 days.

(21) Appl. No.: 14/207,496

(22) Filed: Mar. 12, 2014

(65) Prior Publication Data

US 2014/0266350 A1  Sep. 18, 2014

(30) Foreign Application Priority Data

Mar. 18, 2013 (TW) .............................. 102109522 A

(51) Int. Cl.
*H03L 7/06* (2006.01)
*H03L 7/087* (2006.01)

(52) U.S. Cl.
CPC ........................................ *H03L 7/087* (2013.01)

(58) Field of Classification Search
None
See application file for complete search history.

(56) References Cited

U.S. PATENT DOCUMENTS

| 7,952,406 | B2* | 5/2011 | Chung | .......................... 327/158 |
| 8,212,585 | B1* | 7/2012 | Price | ............................... 326/39 |
| 8,264,262 | B2* | 9/2012 | An | ................................. 327/158 |
| 2008/0278203 | A1* | 11/2008 | Obkircher | ..................... 327/116 |
| 2010/0073060 | A1* | 3/2010 | Nguyen | ......................... 327/255 |
| 2010/0277203 | A1* | 11/2010 | Chien et al. | ..................... 327/18 |
| 2011/0089985 | A1* | 4/2011 | Kao et al. | ....................... 327/161 |

* cited by examiner

*Primary Examiner* — Cassandra Cox
(74) *Attorney, Agent, or Firm* — Winston Hsu; Scott Margo

(57) ABSTRACT

A signal generating circuit comprises a signal synchronizing module and a control circuit. The signal synchronizing module includes: a first delay path for delaying a target signal to generate a first delayed target signal by utilizing a first delay amount; a second delay path for delaying the target signal to generate a second delayed target signal by utilizing a second delay amount larger than the first delay amount; and a logic module, for gating the target signal to generate a first output signal according to the first delayed target signal, or gating the target signal to generate a second output signal according to the second delayed target signal. The control circuit controls the signal synchronizing module to output one of the first output signal and the second output signal according to phase difference between the target signal and a reference signal.

12 Claims, 8 Drawing Sheets

SIGNAL GENERATING CIRCUIT AND METHOD THEREOF

BACKGROUND OF THE INVENTION

1. Field of the Invention

The present invention relates to a signal generating circuit and a method thereof, and particularly relates to a signal generating circuit and a method thereof, which can determine which part of a target signal is output according to a delay phase of the target signal.

2. Description of the Prior Art

In the prior art, a PLL (phase locked loop) is utilized to perform clock signals with different phases. For example, the PLL is utilized to provide an initial phase locked clock signal, and a plurality of delayed phase locked clock signals having phases different from which of the initial phase locked clock signal.

Frequency-dividing operation may needs to be performed to the clock signals generated by the phase locked clock signal, since different devices may need different operating frequency and different duty cycles. However, phase error may occurs between clock signals before frequency dividing and clock signals after frequency dividing since the frequency divider is only triggered by rising edges or falling edges of clock signals. Therefore, the delay for clock signals should be selected based on phase differences for clock signals, to solve phase error between clock signals before frequency dividing and clock signals after frequency dividing.

SUMMARY OF THE INVENTION

One objective of the present invention is providing a method for selecting delay for signals according to the phase difference of clock signals.

Another objective of the present invention is to adjust the phase order for the signals before frequency-dividing and which for the signals after frequency-dividing to be the same.

The present invention provides a signal generating circuit and a signal generating method, to generate an output signal corresponding to the delay phase for the target signal.

One embodiment of the present invention discloses a signal generating circuit comprising a signal phase synchronizing module and a control circuit. The signal phase synchronizing module comprises a first delay path, for utilizing a first delay amount to delay an input signal to generate a first delayed input signal; a second delay path, for utilizing a second delay amount to delay the input signal to generate a second delayed input signal, wherein the first delay amount is smaller than the second delay amount; and a logic module, receiving one of the first delayed input signal and the second delayed input signal, wherein the logic module gates at least part of a target signal to generate a first output signal according to the first delayed input signal while receiving the first delayed input signal, where the logic module gates at least part of the target signal to generate a second output signal according to the second delayed input signal while receiving the second delayed input signal. The control circuit controls the signal generating circuit to output one of the first output signal and the second output signal according to a phase difference between the target signal and a reference signal.

The present invention further discloses a signal generating method, which can be acquired according to the above-mentioned signal generating circuit, thus is omitted for brevity here.

In view of above-mentioned embodiments, the present invention can change the delay amount for the input signal according to a delay phase of the target signal, and can gate the target signal to generate the output signal according to the delayed input signal. By this way, suitable output signal can be generated. If such mechanism is applied for frequency-dividing, the phase order for the signals before frequency-dividing and the signals after frequency-dividing can be adjusted to be the same. Additionally, the present invention further discloses the concept for providing the frequency divider after the delay net, such that the delay caused by the delay net can be omitted due to the characteristics of the frequency divider.

These and other objectives of the present invention will no doubt become obvious to those of ordinary skill in the art after reading the following detailed description of the preferred embodiment that is illustrated in the various figures and drawings.

DETAILED DESCRIPTION

The signal generating circuit and a signal frequency dividing circuit utilizing the signal generating circuit provided by the present invention will be described as below. Please not the following embodiment is only for example and does not mean to limit the present invention. Also, clock signals are utilized as examples to explain the following embodiments, but the signal generating circuit and a signal frequency dividing circuit utilizing the signal generating circuit provided by the present invention can be applied for other signals.

Figure 1:
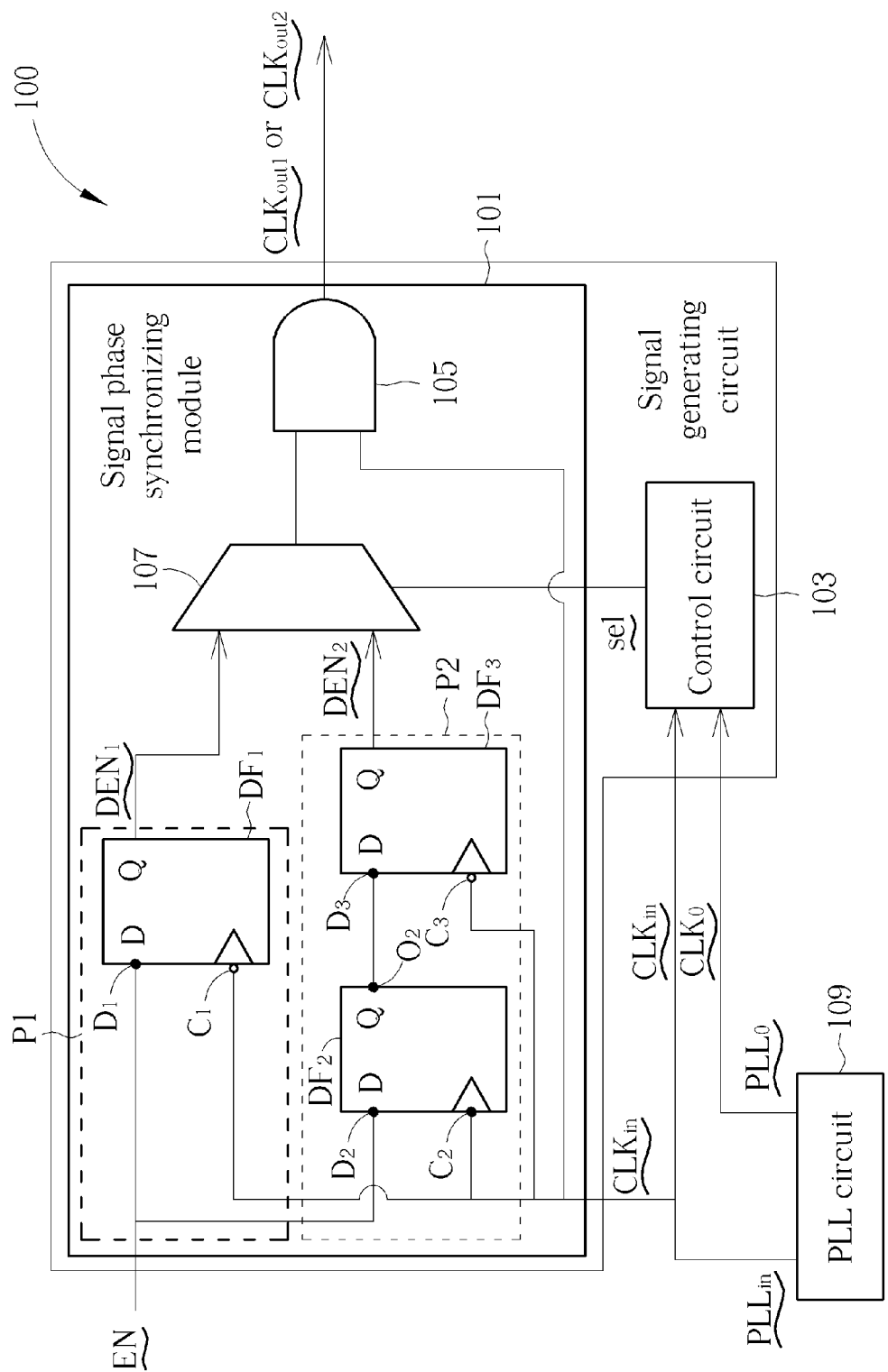
FIG. 1 is a block diagram illustrating a signal generating circuit according to one embodiment of the present invention.

FIG. 1 is a block diagram illustrating a signal generating circuit 100 according to one embodiment of the present invention. As shown in FIG. 1, the signal generating circuit 100 comprises a signal phase synchronizing module 101 and a control circuit 103. The signal phase synchronizing module 101 comprises a first delay path $P_1$, a second delay path $P_2$, a logic module 105 and a multiplexer 107. The first delay path $P_1$ utilizes a first delay amount to delay an input signal EN to generate a first delayed input signal $DEN_1$. The second delay path $P_2$ for utilizes a second delay amount to delay the input signal EN to generate a second delayed input signal $DEN_2$. The first delay amount is smaller than the second delay amount. The logic module 105 receives one of the first delayed input signal $DEN_1$ and the second delayed input signal $DEN_2$. The logic module 105 gates at least part of a target signal $CLK_{in}$ to generate a first output signal $CLK_{out1}$ according to the first delayed input signal $DEN_1$ while receiving the first delayed input signal $DEN_1$. The logic module 105 gates at least part of the target signal $CLK_{in}$ to generate a second output signal $CLK_{out2}$ according to the second delayed input signal $DEN_2$ while receiving the second delayed input signal $DEN_2$. Therefore, the first delayed input signal $DEN_1$ and the second delayed input signal $DEN_2$ are utilized as gating signals in this embodiment. The control circuit 103 generates a selecting signal sel according to a phase difference between the target clock signal $CLK_{in}$ and a reference signal $CLK_0$ to control the multiplex 107 to output one of the first delayed input signal $DEN_1$ and the second delayed input signal $DEN_2$ to the logic module 105

In one embodiment, the first delay path $P_1$ comprises a first D flip flop $DF_1$ comprising a first data terminal $D_1$ receiving the input signal EN and a first clock terminal $C_1$ receiving an inverted signal $CLK_{in}$ of the target signal. The second delay path $P_2$ comprises a second D flip flop $DF_2$ and a third D flip flop $DF_3$. The second D flip flop $DF_2$ comprises a second data terminal $D_2$ receiving the input signal EN, a second clock terminal $C_2$ receiving the target signal $CLK_{in}$ and a second output terminal $O_2$. The third D flip flop $DF_3$ comprises a third data terminal $D_3$ receiving output from the second output terminal $O_2$, and comprises a third clock terminal $C_3$ receiving the inverted signal of the target signal $CLK_{in}$. The multiplexer 107 outputs one of the first delayed input signal $DEN_1$ and the second delayed input signal $DEN_2$ as an output selecting signal $DEN_{out}$ according to the selecting signal sel. The logic module 105 comprises an AND gate having two input terminals respectively receiving the output signal $DEN_{out}$ and the target signal $CLK_{in}$. Please note, although this embodiment firstly utilizes the multiplexer 107 to output one of the first delayed input signal $DEN_1$ and the second delayed input signal $DEN_2$ as an output selecting signal $DEN_{out}$ and then gates the target signal $CLK_{in}$ via the output selecting signal $DEN_{out}$ it does not mean to limit. In another embodiment the target signal $CLK_{in}$ are gated via the first delayed input signal $DEN_1$ and the second delayed input signal $DEN_2$ first, and then one of the signals gated by the first delayed input signal $DEN_1$ and the second delayed input signal $DEN_2$ is output according to the phase difference between the target signal $CLK_{in}$ and a reference signal $CLK_0$ via a multiplexer. That is, the locations for the multiplexer 107 and the logic module 105 can be swapped.

In one embodiment, the first phase locked signal $PLL_{in}$ generated by the PLL circuit 109 is directly utilized as the target signal $CLK_{in}$. In one embodiment, the frequency of the first phase locked signal $PLL_{in}$ is twice as the desired frequency, but it can be any other value. Additionally, the PLL circuit 109 generates an initial phase locked signal $PLL_0$ as well. The first phase locked signal $PLL_{in}$ is a delay version for the initial phase locked signal $PLL_0$. The initial phase locked signal $PLL_0$ is utilized as the reference clock signal $CLK_0$, thus a phase difference between the target signal $CLK_{in}$ and the reference signal $CLK_0$ can also be regarded as a delay phase of the target signal $CLK_{in}$. However, other signal processes can be performed to the initial phase locked signal $PLL_0$ and the first phase locked signal $PLL_{in}$, depending on different design requirements, to form the target signal $CLK_{in}$ and the reference clock signal $CLK_0$ The control circuit 103 generates the selecting signal sel according to the phase difference between the target signal $CLK_{in}$ and the reference signal $CLK_0$. Please note the control circuit 103 can utilize many different methods to acquire the phase difference between the target signal $CLK_{in}$ and the reference signal $CLK_0$. For example, it can be acquired via that the PLL circuit 109 directly informs the signal generating circuit 100 which signal is the target signal, or it can be acquired via comparing the phases for two signals. In one embodiment, if the phase difference between the target signal $CLK_{in}$ and the reference signal $CLK_0$ is smaller than 180°, the control circuit 103 controls the multiplexer 107 to output the first delayed input signal $DEN_1$. Also, if the phase difference between the target signal $CLK_{in}$ and the reference signal $CLK_0$ is larger than 180°, the control circuit 103 controls the multiplexer 107 to output the second delayed input signal $DEN_2$. Please note the standard for outputting the first delayed input signal $DEN_1$ or the second delayed input signal $DEN_2$ is not limited to 180°, the standard can be set according to the design requirement.

Figure 2:
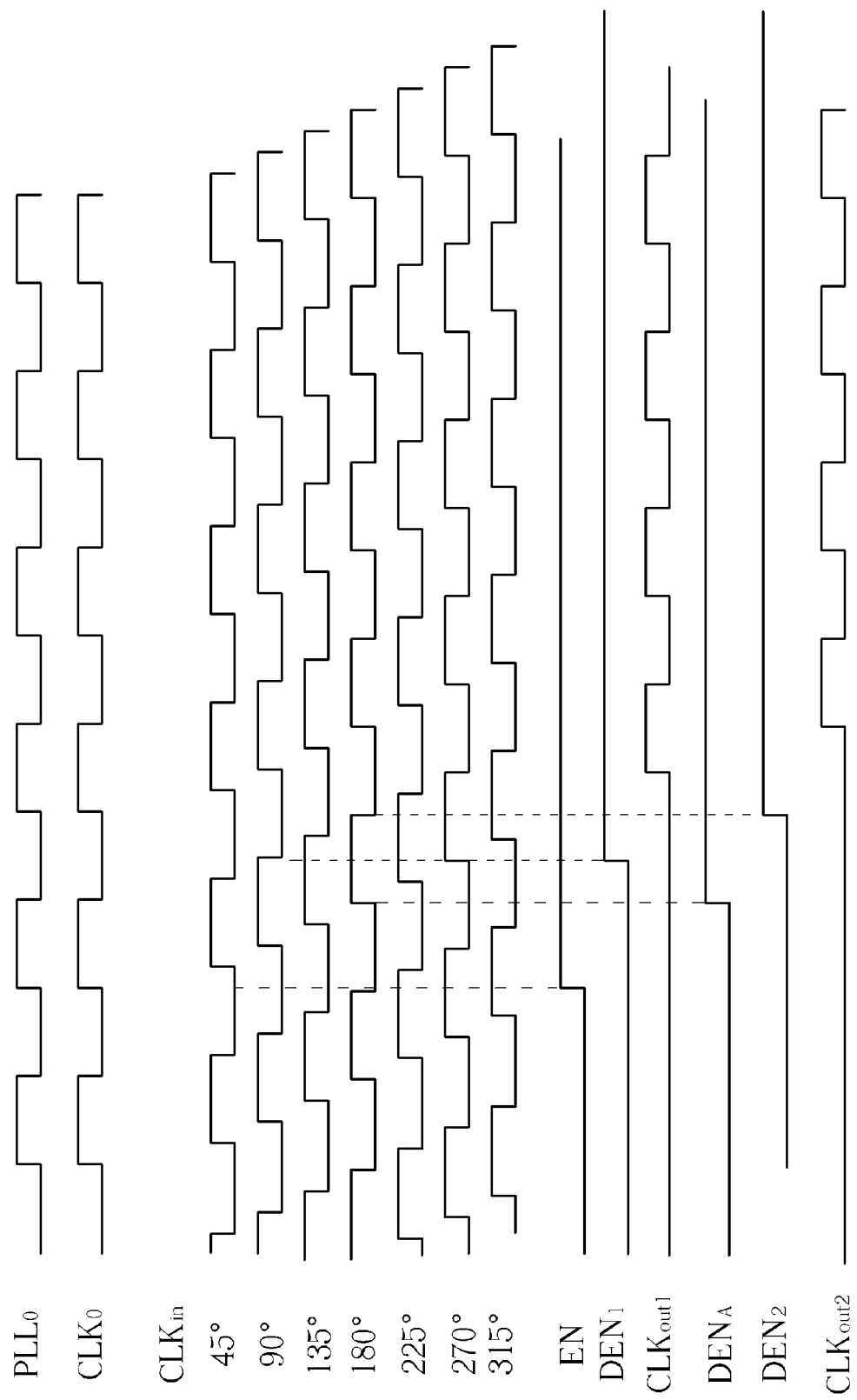
FIG. 2 is a schematic diagram illustrating the signals for the signal generating circuit in FIG. 1.

FIG. 2 is a schematic diagram illustrating the signals for the signal generating circuit in FIG. 1. As shown in FIG. 2, the initial phase locked signal $PLL_0$ is utilized as the reference clock signal $CLK_0$ (but not limited), and the first phase locked signal $PLL_{in}$ (not illustrated in FIG. 2) is utilized as the target signal $CLK_{in}$. The first phase locked signal $PLL_{in}$ is a delay version for the initial phase locked signal $PLL_0$. Therefore, in such example the target signal $CLK_{in}$ may have various phases different from the reference signal $CLK_0$. In this embodiment, 45°, 90°, 135°, 180°, 225°, 270°, and 315° are utilized as examples for explanation, but it does not mean to be limited to these angles. Specifically, the cases that the phase differences between the target signal $CLK_{in}$ and the reference signal $CLK_0$ are respectively 90° and 180° are taken for examples. As above-mentioned, if the phase difference between the target signal $CLK_{in}$ and the reference signal $CLK_0$ is smaller than 180% the control circuit 103 controls the multiplexer 107 to output the first delayed input signal $DEN_1$ (i.e. utilizing the first delay path $P_1$), and if the phase difference between the target signal $CLK_{in}$ and the reference signal $CLK_0$ is larger than 180°, the control circuit 103 controls the multiplexer 107 to output the second delayed input signal $DEN_2$ (i.e. utilizing the second delay path $P_2$). Therefore the first delay path $P_1$ is utilized if the phase difference between the target signal $CLK_{in}$ and the reference signal $CLK_0$ is 90°. The first clock terminal $C_1$ of the first flip flop $DF_1$ receives an inverted signal of the target signal $CLK_{in}$, therefore the first flip flop $DF_1$ is trigged by a falling edge of the target signal $CLK_{in}$ to generate the first delayed input signal $DEN_1$ when a voltage level of the input signal EN is high. Besides, the logic module 105 (AND gate in this example) outputs a low value when a voltage level of the first delayed input signal $DEN_1$ is low, and outputs the value of the target signal $CLK_{in}$ to generate the first output signal $CLK_{out1}$ when a voltage level of the first delayed input signal $DEN_1$ is high. Therefore, it can be regarded as that the first delayed input signal $DEN_1$ is utilized to gate the target signal $CLK_{in}$ to generate the first output signal $CLK_{out1}$.

The second delay path $P_2$ is utilized if the phase difference between the target signal $CLK_{in}$ and the reference signal $CLK_0$ is 180°. The second delay path $P_2$ comprises a second D flip flop $DF_2$ and a third D flip flop $DF_3$. The second D flip flop $DF_2$ comprises a second clock terminal $C_2$ receiving the target signal $CLK_{in}$, and the third D flip flop $DF_3$ comprises a third clock terminal $C_3$ receiving an inverted signal of the target signal $CLK_{in}$. Therefore the second delay path $P_2$ is triggered by a rising edge of the target signal $CLK_{in}$ to generate a temporary delayed input clock signal $DEN_A$ when the input signal EN has a high voltage level, and is triggered by a falling edge of the target signal $CLK_{in}$ to generate the second delayed input signal $DEN_2$ when the temporary delayed input clock signal $DEN_A$ has a high voltage level. The logic module 105 outputs the target signal $CLK_{in}$ to form the second output signal $CLK_{out2}$ when the second delayed input signal $DEN_2$ has a high voltage level. Therefore, it can be regarded as that the second delayed input signal $DEN_2$ is utilized to gate the target signal $CLK_{in}$ to generate the second output signal $CLK_{out2}$.

Figure 3:
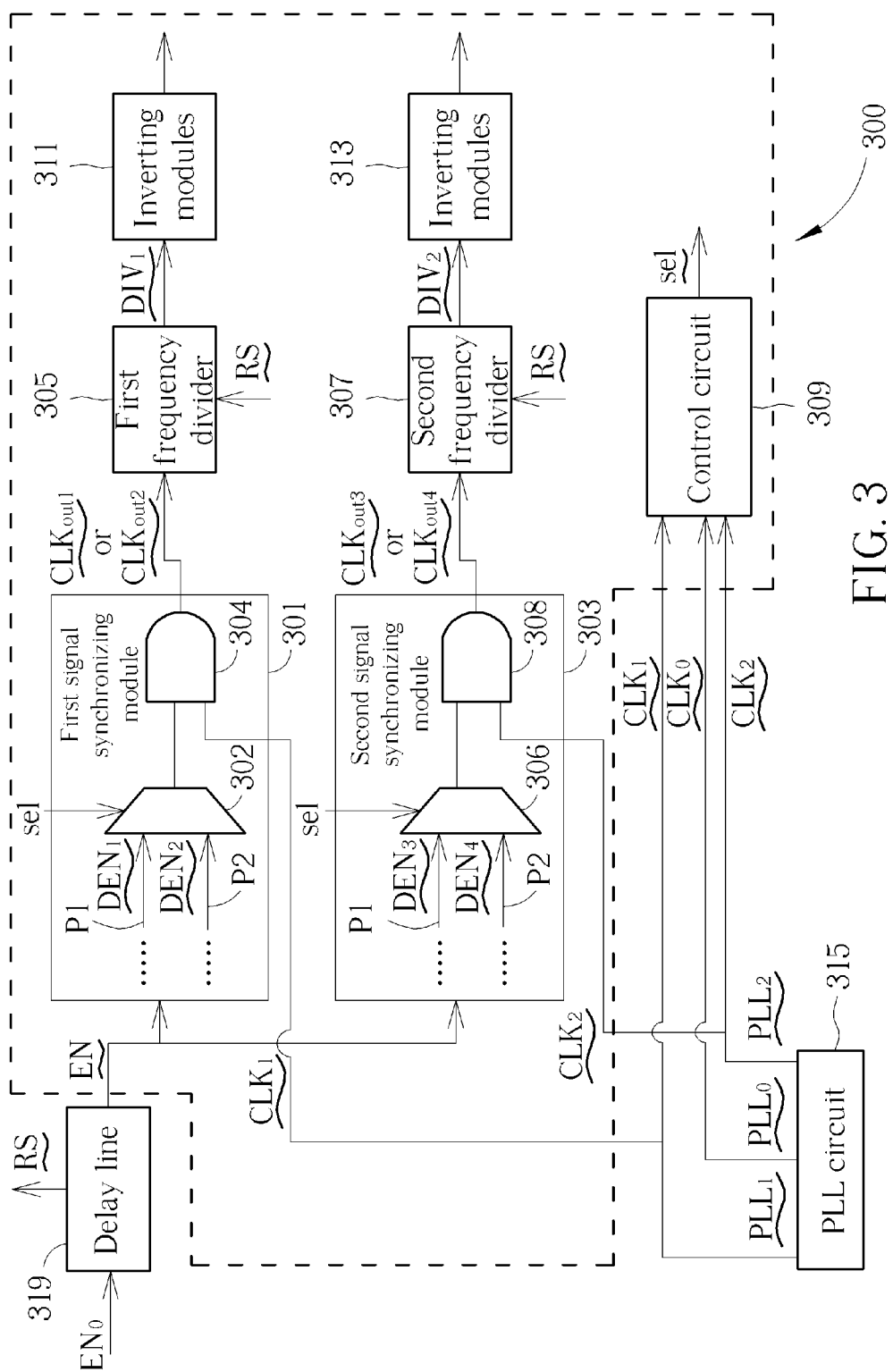
FIG. 3 is a block diagram illustrating the signal frequency dividing circuit of the signal generating circuit in FIG. 1.

The signal generating circuit 100 in FIG. 1 can be applied to a signal frequency-dividing circuit. FIG. 3 is a block diagram illustrating the signal frequency dividing circuit 300 of the signal generating circuit in FIG. 1. It should be noted that the example in FIG. 3 utilizes two signal synchronizing modules, but the number for the signal synchronizing modules can be more than two. As shown in FIG. 3, the signal frequency dividing circuit 300 comprises a first signal synchronizing module 301, a second signal synchronizing module 303, a first frequency divider 305, a second frequency divider 307 and a control circuit 309. Please note the devices in the first signal synchronizing module 301 and the second signal synchronizing module 303 are the same as which of the signal synchronizing module 101 in FIG. 1, but some devices in the first signal synchronizing module 301 and the second signal synchronizing module 303 are not illustrated for brevity here.

The first signal synchronizing module 301 and the second signal synchronizing module 303 share the control circuit 309, and each of the first signal synchronizing module 301 and the second signal synchronizing module 303 comprises a first delay path $P_1$ and a second delay path $P_2$ for delaying the input signal EN to generate the first delayed input signal $DEN_1$, the second delayed input signal $DEN_2$, the third delayed input signal $DEN_3$ and the fourth delayed input signal $DEN_4$. The first signal synchronizing module 301 utilizes the first delayed input signal $DEN_1$ to gate the first target clock signal $CLK_1$ to generate the first output clock signal $CLK_{out1}$, and the second signal synchronizing module 303 utilizes the third delayed input signal $DEN_3$ to gate the second target clock signal $CLK_2$ to generate the third output clock signal $CLK_{out3}$. Additionally, the first signal synchronizing module 301 utilizes the second delayed input signal $DEN_2$ to gate the second target clock signal $CLK_2$ to generate the second output clock signal $CLK_{out2}$, and the second signal synchronizing module 303 utilizes the fourth delayed input signal $DEN_4$ to gate the second target clock signal $CLK_2$ to generate the fourth output clock signal $CLK_{out4}$. The control circuit 309 generates a selecting signal sel to the multiplexer 302 according to a phase difference between the first target signal $CLK_1$ and the reference signal $CLK_0$, to output one of the first delayed input signal $DEN_1$ and the second delayed input signal $DEN_2$. By this way, it is also determined which one of the first output signal $CLK_{out1}$ and the second output signal $CLK_{out2}$ is outputted by the logic module 304. Similarly, the control circuit 309 generates a selecting signal sel to the multiplexer 306 according to a phase difference between the second target signal $CLK_2$ and the reference signal $CLK_0$, to output one of the third delayed input signal $DEN_3$ and the fourth delayed input signal $DEN_4$. By this way, it is also determined which one of the third output signal $CLK_{out3}$ and the fourth output signal $CLK_{out4}$ is outputted by the logic module 308.

The output of the first signal synchronizing module 301 can be regarded as a first signal to be frequency-divided, and the output of the second signal synchronizing module 303 can be regarded as a second signal to be frequency-divided. The first frequency divider 305 frequency-divides the first signal to be frequency-divided ($CLK_{out1}$ or $CLK_{out2}$) to generate a first frequency-divided signal $DIV_1$, and the second frequency divider 307 frequency-divides the second signal to be frequency-divided ($CLK_{out3}$ or $CLK_{out4}$) to generate a second frequency-divided signal $DIV_2$. The signal with two times frequency may has error of 180° after frequency-dividing. Therefore the phase orders for the signals before frequency-dividing and the signals after frequency-dividing can be adjusted to be the same, if the delay amount of the input signal is selected according to a delay phase of the target signal (i.e. the phase difference from the reference signal and the delayed input signal is utilized to control which part of the target signal is output. In this example, the phase order for the first target clock signal $CLK_1$ and the second target clock signal $CLK_2$ is the same as which for the first frequency-divided signal $DIV_1$ and the second frequency-divided signal $DIV_2$. Therefore, persons skilled in the art can change the phase for the target signal and the delay amount for the input signal to adjust the phase orders for the signals before frequency-dividing and the signals after frequency-dividing to be the same, in view of the concept disclosed by the present invention. Besides, although the phase orders for the signals before frequency-dividing and the signals after frequency-dividing can be adjusted to be the same, the signal may still have phase different of 180° (i.e. the signals are inverted), thus the signal frequency-dividing circuit 300 can further comprise an inverting modules 311 or 313 to invert the frequency-divided signals.

In one embodiment, the first target signal $CLK_1$ is from a first phase locked signal $PLL_1$, the second target signal $CLK_2$ is from a second phase locked signal $PLL_2$, and the reference signal $CLK_0$ is from an initial phase locked signal $PLL_0$. The first phase locked signal $PLL_1$, the second phase locked signal $PLL_2$, and the initial phase locked signal $PLL_0$ are from a single PLL circuit 315, and the first phase locked signal $PLL_1$, the second phase locked signal $PLL_2$ are delay versions for the initial phase locked signal $PLL_0$. the first target signal $CLK_1$ and the second target signal $CLK_2$ can be applied to different function. For example, if the signal frequency-dividing circuit in FIG. 3 is applied to a DDR (Double Rate Synchronous) memory, the first target signal $CLK_1$ and the second target signal $CLK_2$ can be operating clocks for different memory devices. The input signal EN is generated via delaying an initial input signal $EN_0$ utilizing the delay line 319. Additionally, the delay line 319 has two outputs for resetting the first frequency divider 305 and the second frequency divider 307. One output is the input signal EN having a larger delay amount, the other one is the reset signal RS having a smaller delay amount.

Figure 4:
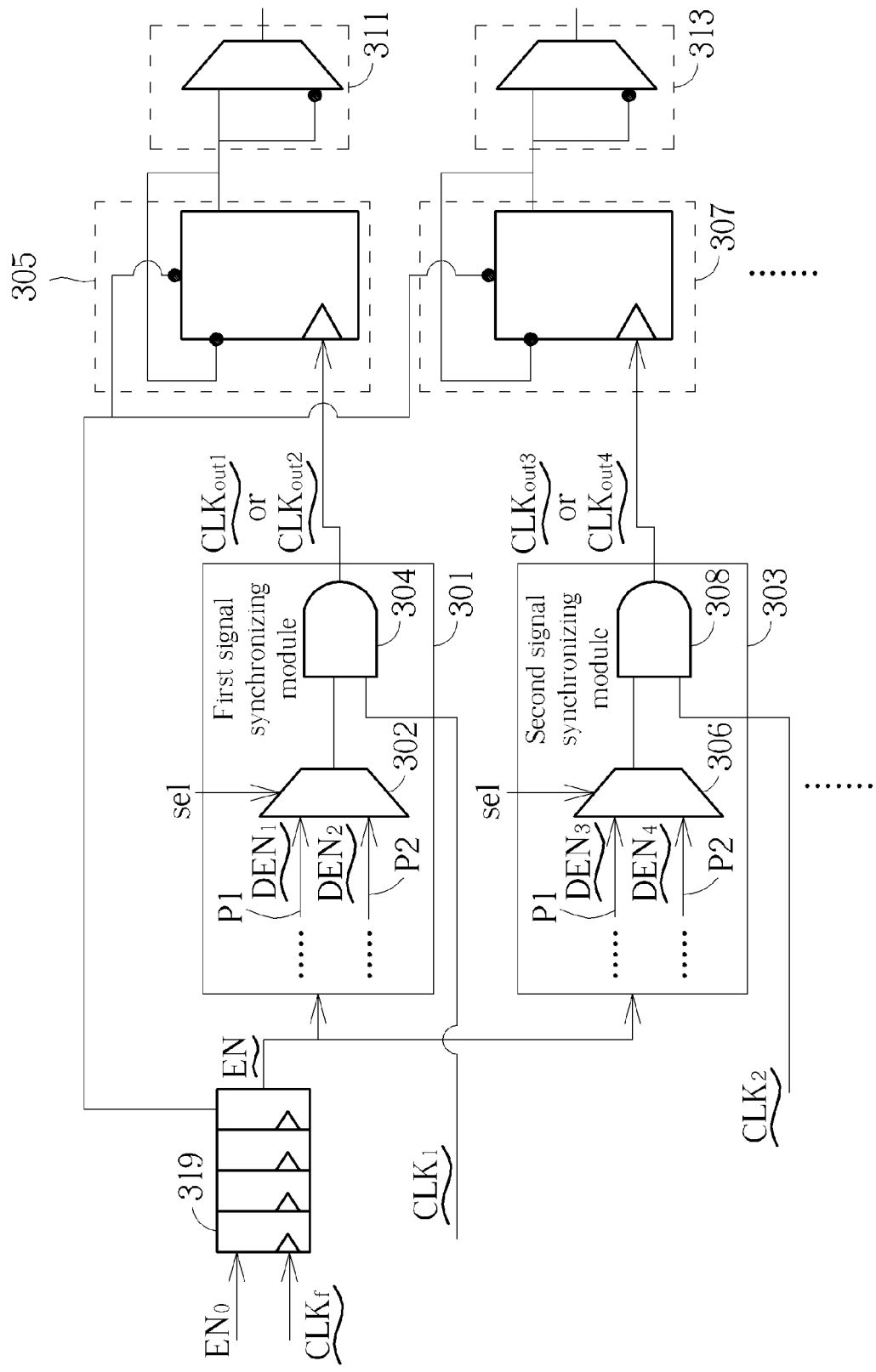
FIG. 4 illustrates detail circuits for the signal frequency dividing circuit shown in FIG. 3.

FIG. 4 illustrates detail circuits for the signal frequency dividing circuit shown in FIG. 3. As shown in FIG. 4, the first frequency divider 305 and the second frequency divider 307 can be flip flops, and the first inverting module 311, the second inverting module 313 can be multiplexers. Therefore, the first inverting module 311, the second inverting module 313 can output the first frequency-divided signal $DIV_1$, the second frequency-divided signal $DIV_2$ or inverted signals thereof. The first inverting module 311, the second inverting module 313 can be controlled by a control circuit 309. The delay line 319 can comprise a plurality of inverters and can be triggered by a clock signal CLKf with a constant frequency to trigger the generation for the input signal EN.

Figure 5:
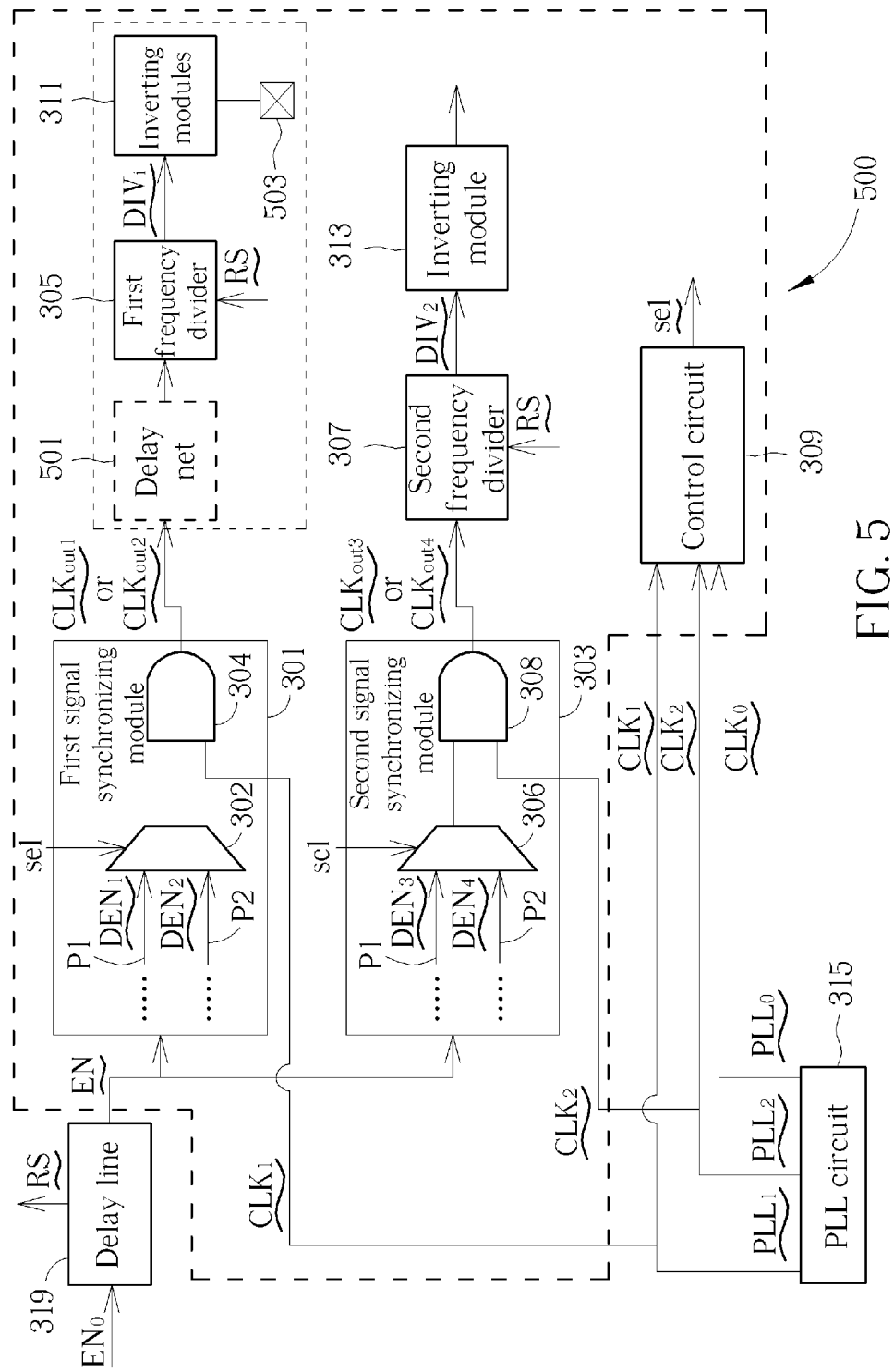
FIG. 5 is a block diagram for the signal frequency dividing circuit according to another embodiment of the present invention.

FIG. 5 is a block diagram for the signal frequency dividing circuit 500 according to another embodiment of the present invention. In this embodiment, the first frequency divider 305 is provided after the delay net 501, thus it can be regarded that the first frequency divider 305 is directly coupled to the pad 503. If the inverting module 311 exists, the inverting module 311 is regarded as directly coupled to the pad 503. Besides the devices shown in FIG. 5, the signal frequency dividing circuit 500 needs more other devices and wires such that the signal frequency dividing circuit 500 can operate smoothly, and the delay net 501 is an aggregation for these devices and wires. For example, the delay net 501 is a clock tree. The delay caused by above-mentioned devices and wires may vary the duty cycle of the signal, thus it may causes disadvantages for a circuit needs signals with accurate duty cycles. If the frequency divider is moved to be after the delay net 501, the signal duty cycle variation caused by the delay net 501 can be omitted since frequency divider is only triggered by the falling edge or the rising edge of signals. Please note in the example of FIG. 5 only the first frequency divider 305 on the path of the first signal synchronizing module 301 is moved to be after the delay net, but the frequency dividers on the paths of other signal synchronizing modules can be moved to be after the delay net.

Figure 6:
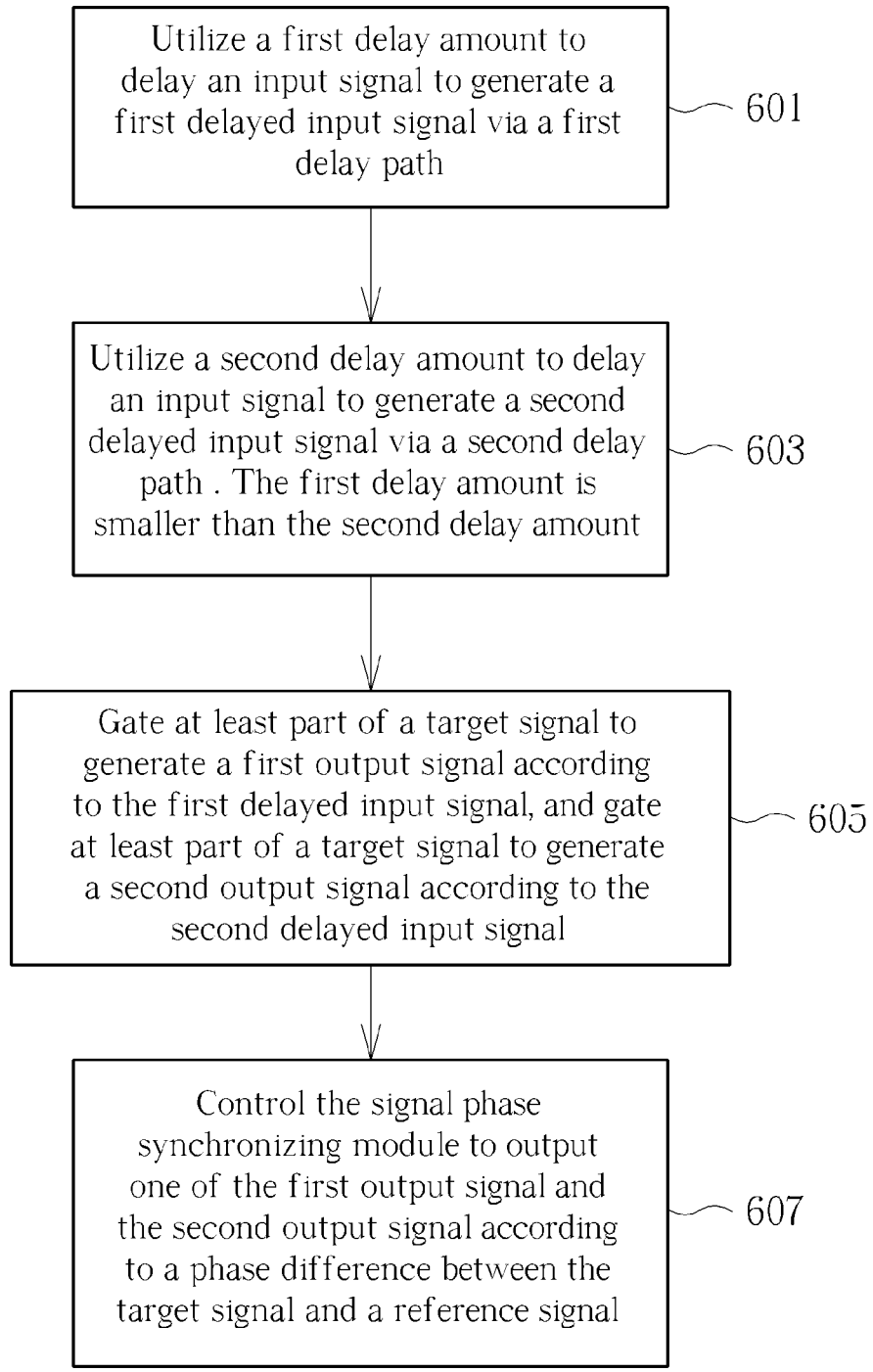
FIG. 6 is a flow chart illustrating a signal generating method according

In view of above-mentioned embodiments, the signal generating method in FIG. 6 can be acquired, which comprises the following steps:

Step 601

Utilize a first delay amount to delay an input signal EN to generate a first delayed input signal $DEN_1$ via a first delay path $P_1$.

Step 603

Utilize a second delay amount to delay an input signal EN to generate a second delayed input signal $DEN_2$ via a second delay path $P_2$. The first delay amount is smaller than the second delay amount.

Step 605

Gate at least part of a target signal $CLK_{in}$ to generate a first output signal $CLK_{out1}$ according to the first delayed input signal $DEN_1$, and gate at least part of a target signal $CLK_{in}$ to generate a second output signal $CLK_{out2}$ according to the second delayed input signal $DEN_2$.

Step 607

Control the signal phase synchronizing module 101 to output one of the first output signal $CLK_{out1}$ and the second output signal $CLK_{out2}$ according to a phase difference between the target signal $CLK_{in}$ and a reference signal $CLK_0$.

As abovementioned, the multiplexer 107 and the logic module 105 in FIG. 1 can be swapped, thus the signal generating method in FIG. 6 can be summarized as: utilizing a first delay amount to delay an input signal to generate a first delayed input signal via a first delay path; utilizing a second delay amount to delay the input signal to generate a second delayed input signal via a second delay path, wherein the first delay amount is smaller than the second delay amount; selecting one of the first delayed input signal and the second delayed input signal as an output selecting signal according to a phase difference between a target signal and a reference signal; and gating at least part of the target signal as an output signal according to the output selecting signal.

Figure 7A:
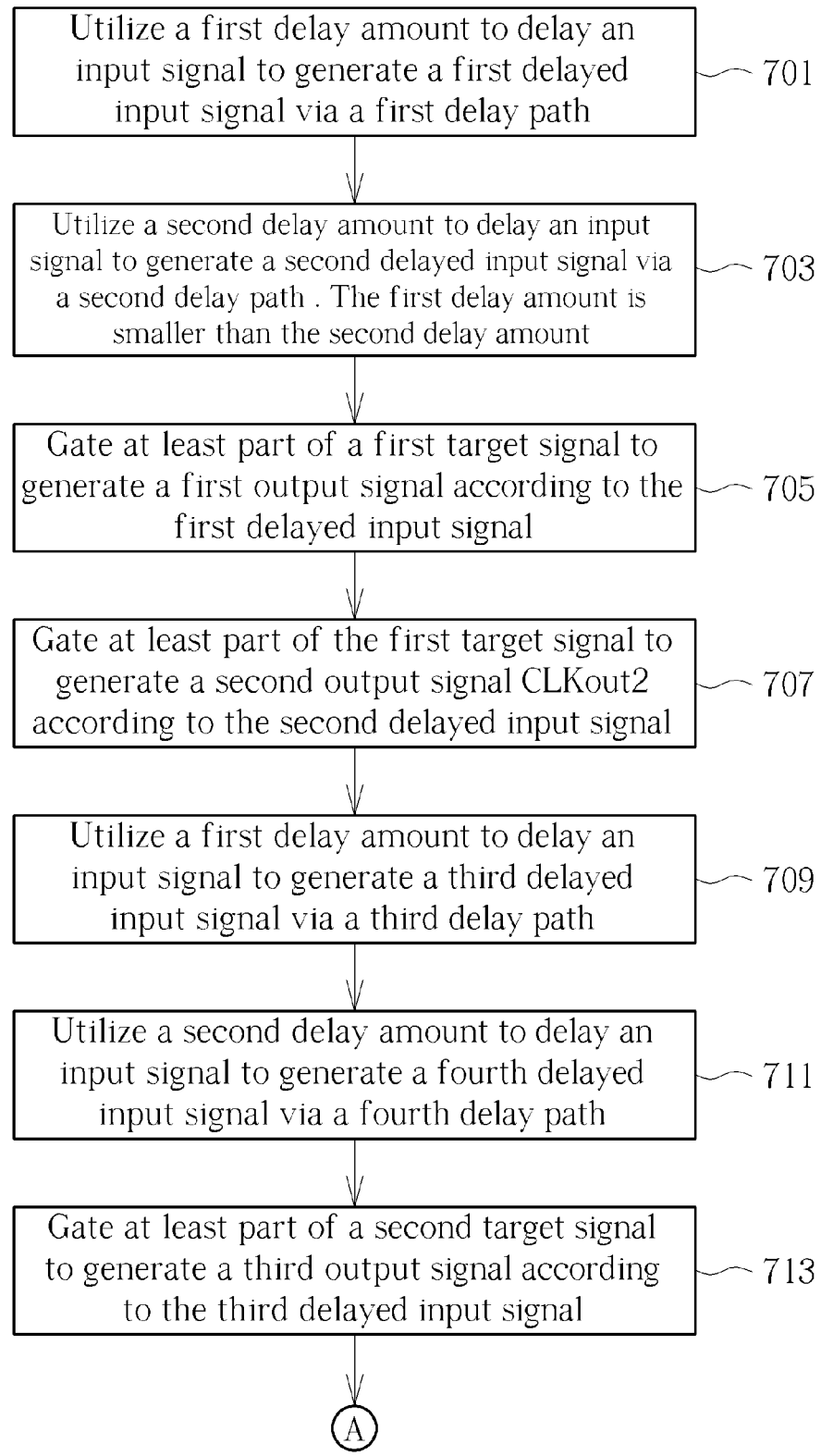
FIG. 7A and FIG. 7B are flow charts illustrating the signal frequency dividing method according to embodiments of the present invention.
Figure 7B:
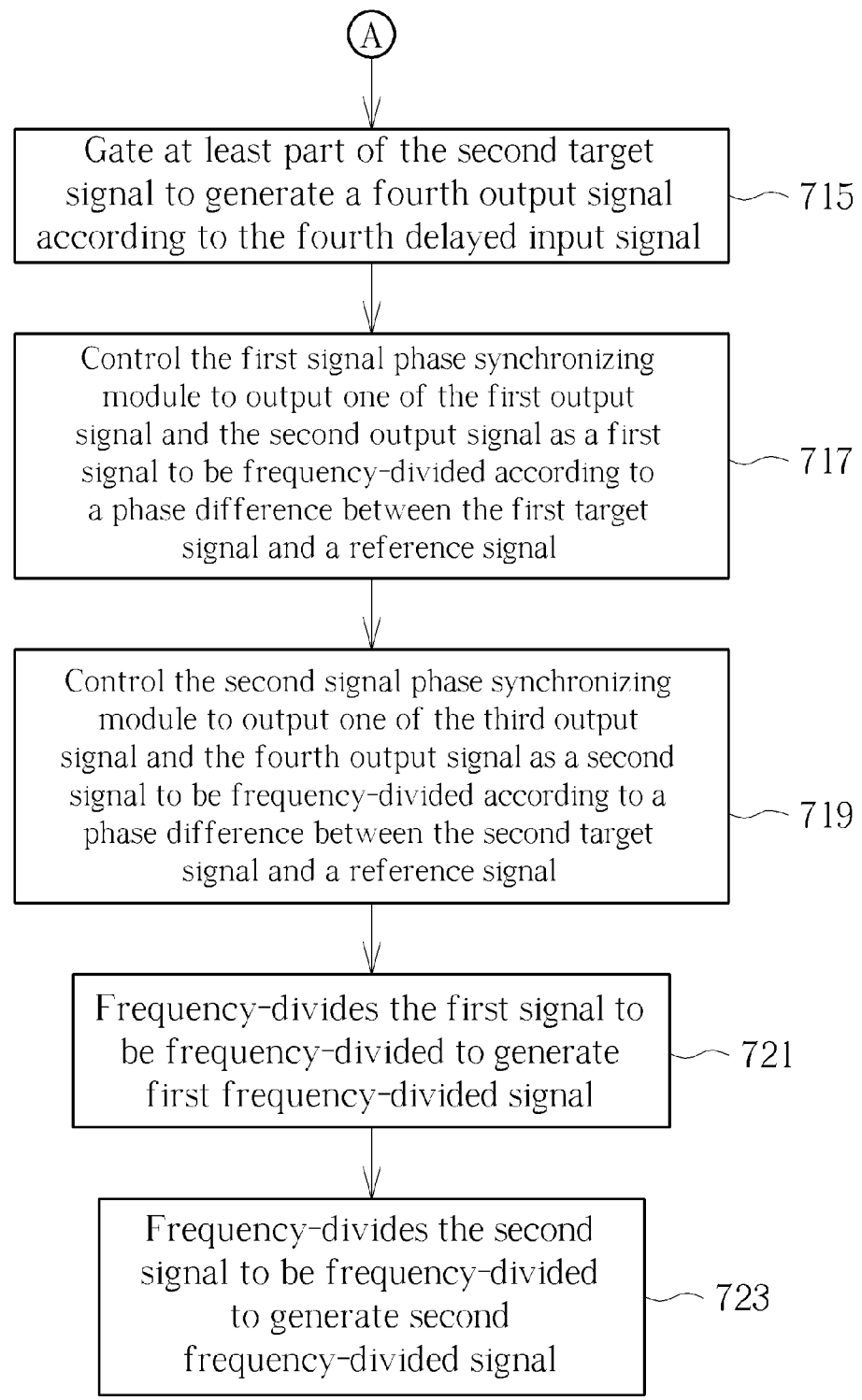

In view of above-mentioned embodiments, the signal generating methods in FIG. 7A and FIG. 7B can be acquired, which comprises the following steps:

Step 701

Utilize a first delay amount to delay an input signal EN to generate a first delayed input signal $DEN_1$ via a first delay path $P_1$.

Step 703

Utilize a second delay amount to delay an input signal EN to generate a second delayed input signal $DEN_2$ via a second delay path $P_2$. The first delay amount is smaller than the second delay amount.

Step 705

Gate at least part of a first target signal $CLK_1$ to generate a first output signal $CLK_{out1}$ according to the first delayed input signal $DEN_1$ Step 707

Gate at least part of the first target signal $CLK_1$ to generate a second output signal $CLK_{out2}$ according to the second delayed input signal $DEN_2$.

Step 709

Utilize a first delay amount to delay an input signal EN to generate a third delayed input signal $DEN_3$ via a third delay path $P_3$.

Step 711

Utilize a second delay amount to delay an input signal EN to generate a fourth delayed input signal $DEN_4$ via a fourth delay path $P_4$.

Step 713

Gate at least part of a second target signal $CLK_2$ to generate a third output signal $CLK_{out3}$ according to the third delayed input signal $DEN_3$.

Step 715

Gate at least part of the second target signal $CLK_2$ to generate a fourth output signal $CLK_{out4}$ according to the fourth delayed input signal $DEN_4$.

Step 717

Control the first signal phase synchronizing module 301 to output one of the first output signal $CLK_{out1}$ and the second output signal $CLK_{out2}$ as a first signal to be frequency-divided according to a phase difference between the first target signal $CLK_1$ and a reference signal $CLK_0$.

Step 719

Control the second signal phase synchronizing module 303 to output one of the third output signal $CLK_3$ and the fourth output signal $CLK_{out4}$ as a second signal to be frequency-divided according to a phase difference between the second target signal $CLK_2$ and a reference signal $CLK_0$.

Step 721

Frequency-divides the first signal to be frequency-divided to generate first frequency-divided signal $DIV_1$.

Step 723

Frequency-divides the second signal to be frequency-divided to generate second frequency-divided signal $DIV_2$.

Other detail steps for FIG. 6 and FIG. 7 can be acquired according to the above-mentioned embodiments, thus are omitted for brevity here.

In view of above-mentioned embodiments, the present invention can change the delay amount for the input signal according to a delay phase of the target signal, and can gate the target signal to generate the output signal according to the delayed input signal. By this way, suitable output signal can be generated. If such mechanism is applied for frequency-dividing, the phase order for the signals before frequency-dividing and the signals after frequency-dividing can be adjusted to be the same. Additionally, the present invention further discloses the concept for providing the frequency divider after the delay net, such that the delay caused by the delay net can be omitted due to the characteristics of the frequency divider.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A signal generating circuit, comprising:
  a signal phase synchronizing module, comprising:
    a first delay path, for receiving a target signal and for utilizing a first delay amount to delay an input signal to generate a first delayed input signal based on the target signal;
    a second delay path, for receiving the target signal and for utilizing a second delay amount to delay the input signal to generate a second delayed input signal, wherein the first delay amount is smaller than the second delay amount based on the target signal; and a logic module, receiving one of the first delayed input signal and the second delayed input signal, wherein the logic module gates at least part of the target signal to generate a first output signal according to the first delayed input signal while receiving the first delayed input signal, where the logic module gates at least part of the target signal to generate a second output signal according to the second delayed input signal while receiving the second delayed input signal; and a control circuit, for controlling the signal generating circuit to output one of the first output signal and the second output signal according to a phase difference between the target signal and a reference signal.

2. The signal generating circuit of claim 1,
wherein the first delay path comprises a first D flip flop comprising a first data terminal receiving the input signal and a first clock terminal receiving an inverted signal of the target signal;
wherein the second delay path comprises a second D flip flop and a third D flip flop, where the second D flip flop comprises a second data terminal receiving the input signal, a second clock terminal receiving the target signal and a second output terminal, wherein the third D flip flop comprises a third data terminal receiving output from the second output terminal, and comprises a third clock terminal receiving the inverted signal of the target signal.

3. The signal generating circuit of claim 1, further comprising:
a multiplexer controlled by the control circuit to output one of the first delayed input signal and the second delayed input signal;
wherein the logic module comprises an AND gate having two input terminals respectively receiving the output from the multiplexer and the target signal to generate one of the first output signal and the second output signal.

4. The signal generating circuit of claim 1, wherein the control circuit controls the signal phase synchronizing module to output the first output signal when the phase difference between the target signal and the reference signal is smaller than a predetermined value; wherein the control circuit controls the signal phase synchronizing module to output the second output signal when the phase difference between the target signal and the reference signal is larger than a predetermined value.

5. The signal generating circuit of claim 1, wherein the target signal and the reference signal are from a single phase looked loop circuit.

6. The signal generating circuit of claim 1, wherein the target signal and the reference signal are not output from the first delay path and the second delay path.

7. A signal generating method, comprising:
receiving a target signal and utilizing a first delay amount to delay an input signal to generate a first delayed input signal via a first delay path based on the target signal;
receiving the target signal and utilizing a second delay amount to delay the input signal to generate a second delayed input signal via a second delay path, wherein the first delay amount is smaller than the second delay amount based on the target signal;
gating at least part of the target signal to generate a first output signal according to the first delayed input signal;
gating at least part of the target signal to generate a second output signal according to the second delayed input signal; and
outputting one of the first output signal and the second output signal according to a phase difference between the target signal and a reference signal.

8. The signal generating method of claim 7, further comprising:
outputting the first output signal when the phase difference between the target signal and the reference signal is smaller than a predetermined value;
outputting the second output signal when the phase difference between the target signal and the reference signal is larger than a predetermined value.

9. The signal generating method of claim 7, comprising:
generating the target signal according to a first phase locked signal; and
generating the reference signal according to an initial phase locked signal;
wherein the first phase locked signal and the initial phase locked signal are from a single phase looked loop circuit;
wherein the first phase locked signal is a delayed version for the initial phase locked signal.

10. The signal generating method of claim 7, wherein the target signal and the reference signal are not output from the first delay path and the second delay path.

11. A signal generating method, comprising:
utilizing a first delay amount to delay an input signal to generate a first delayed input signal;
utilizing a second delay amount to delay the input signal to generate a second delayed input signal, wherein the first delay amount is smaller than the second delay amount;
selecting one of the first delayed input signal and the second delayed input signal as a output selecting signal according to a phase difference between a reference signal and a target signal; and
gating at least part of the target signal as an output signal according the output selecting signal.

12. The signal generating method of claim 11, further comprising:
utilizing the first delayed input signal as the output selecting signal if the phase difference between the target signal and the reference signal is smaller than a predetermined value; and
utilizing the second delayed input signal as the output selecting signal if the phase difference between the target signal and the reference signal is larger than the predetermined value.

* * * * *